US008129706B2

(12) United States Patent
Ho et al.

(10) Patent No.: US 8,129,706 B2
(45) Date of Patent: Mar. 6, 2012

(54) STRUCTURES AND METHODS OF A BISTABLE RESISTIVE RANDOM ACCESS MEMORY

(75) Inventors: ChiaHua Ho, Kaohsiung (TW);
Erh-Kun Lai, Taichung County (TW);
Kuang Yeu Hsieh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 609 days.

(21) Appl. No.: 11/381,973

(22) Filed: May 5, 2006

(65) Prior Publication Data
US 2007/0257300 A1 Nov. 8, 2007

(51) Int. Cl.
*H01L 29/04* (2006.01)
*H01L 47/00* (2006.01)
(52) U.S. Cl. ............. 257/3; 257/2; 257/4; 257/E29.002; 257/E29.003
(58) Field of Classification Search .................. 257/2–4, 257/E29.001–E29.003, E47.001
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,534,712 A | 7/1996 | Ovshinsky et al. | |
| 5,687,112 A | 11/1997 | Ovshinsky | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |

(Continued)

FOREIGN PATENT DOCUMENTS
WO WO 00/45108 A1 8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner* — Anh Phung
*Assistant Examiner* — Allison P Bernstein
(74) *Attorney, Agent, or Firm* — Kenta Suzue; Haynes Beffel & Wolfeld LLP

(57) ABSTRACT

Structures and methods to form a bistable resistive random access memory for reducing the amount of heat dissipation from electrodes by confining a heating region in the memory cell device are described. The heating region is confined in a kernel comprising a programmable resistive memory material that is in contact with an upper programmable resistive memory member and a lower programmable resistive memory member. The lower programmable resistive member has sides that align with sides of a bottom electrode comprising a tungsten plug. The lower programmable resistive member and the bottom electrode function a first conductor so that the amount of heat dissipation from the first conductor is reduced. The upper programmable resistive memory material and a top electrode function as a second conductor so that the amount of heat dissipation from the second conductor is reduced.

24 Claims, 11 Drawing Sheets

U.S. PATENT DOCUMENTS

| | | | |
|---|---|---|---|
| 5,879,955 | A | 3/1999 | Gonzalez et al. |
| 5,920,788 | A | 7/1999 | Reinberg |
| 5,952,671 | A | 9/1999 | Reinberg et al. |
| 5,970,336 | A | 10/1999 | Wolstenholme et al. |
| 5,985,698 | A | 11/1999 | Gonzalez et al. |
| 5,998,244 | A | 12/1999 | Wolstenholme et al. |
| 6,011,725 | A | 1/2000 | Eitan |
| 6,025,220 | A | 2/2000 | Sandhu |
| 6,031,287 | A | 2/2000 | Harshfield |
| 6,034,882 | A | 3/2000 | Johnson et al. |
| 6,077,729 | A | 6/2000 | Harshfield |
| 6,087,674 | A | 7/2000 | Ovshinsky et al. |
| 6,104,038 | A | 8/2000 | Gonzalez et al. |
| 6,111,264 | A | 8/2000 | Wolstenholme et al. |
| 6,114,713 | A | 9/2000 | Zahorik |
| 6,117,720 | A | 9/2000 | Harshfield |
| 6,147,395 | A | 11/2000 | Gilgen |
| 6,150,253 | A | 11/2000 | Doan et al. |
| 6,153,890 | A | 11/2000 | Wolstenholme et al. |
| 6,177,317 | B1 | 1/2001 | Huang et al. |
| 6,185,122 | B1 | 2/2001 | Johnson et al. |
| 6,189,582 | B1 | 2/2001 | Reinberg et al. |
| 6,236,059 | B1 | 5/2001 | Wolstenholme et al. |
| RE37,259 | E | 7/2001 | Ovshinsky |
| 6,271,090 | B1 | 8/2001 | Huang et al. |
| 6,280,684 | B1 | 8/2001 | Yamada et al. |
| 6,287,887 | B1 | 9/2001 | Gilgen |
| 6,314,014 | B1 | 11/2001 | Lowrey et al. |
| 6,320,786 | B1 | 11/2001 | Chang et al. |
| 6,339,544 | B1 * | 1/2002 | Chiang et al. ............... 365/163 |
| 6,351,406 | B1 | 2/2002 | Johnson et al. |
| 6,420,215 | B1 | 7/2002 | Knall et al. |
| 6,420,216 | B1 | 7/2002 | Clevenger et al. |
| 6,420,725 | B1 | 7/2002 | Harshfield |
| 6,423,621 | B2 | 7/2002 | Doan et al. |
| 6,429,064 | B1 | 8/2002 | Wicker |
| 6,462,353 | B1 | 10/2002 | Gilgen |
| 6,483,736 | B2 | 11/2002 | Johnson et al. |
| 6,487,114 | B2 | 11/2002 | Jong et al. |
| 6,501,111 | B1 | 12/2002 | Lowrey |
| 6,511,867 | B2 | 1/2003 | Lowrey et al. |
| 6,512,241 | B1 | 1/2003 | Lai |
| 6,514,788 | B2 | 2/2003 | Quinn |
| 6,534,781 | B2 | 3/2003 | Dennison |
| 6,545,903 | B1 | 4/2003 | Wu |
| 6,555,860 | B2 | 4/2003 | Lowrey et al. |
| 6,563,156 | B2 | 5/2003 | Harshfield |
| 6,566,700 | B2 | 5/2003 | Xu |
| 6,567,293 | B1 | 5/2003 | Lowrey et al. |
| 6,579,760 | B1 | 6/2003 | Lung |
| 6,586,761 | B2 | 7/2003 | Lowrey |
| 6,589,714 | B2 | 7/2003 | Maimon et al. |
| 6,593,176 | B2 | 7/2003 | Dennison |
| 6,597,009 | B2 | 7/2003 | Wicker |
| 6,605,527 | B2 | 8/2003 | Dennison et al. |
| 6,605,821 | B1 | 8/2003 | Lee et al. |
| 6,607,974 | B2 | 8/2003 | Harshfield |
| 6,613,604 | B2 | 9/2003 | Maimon et al. |
| 6,617,192 | B1 | 9/2003 | Lowrey et al. |
| 6,621,095 | B2 | 9/2003 | Chiang et al. |
| 6,627,530 | B2 | 9/2003 | Li et al. |
| 6,639,849 | B2 | 10/2003 | Takahashi et al. |
| 6,673,700 | B2 | 1/2004 | Dennison et al. |
| 6,744,088 | B1 | 6/2004 | Dennison |
| 6,747,286 | B2 * | 6/2004 | Lowrey ............... 257/3 |
| 6,791,102 | B2 | 9/2004 | Johnson et al. |
| 6,797,979 | B2 | 9/2004 | Chiang et al. |
| 6,800,563 | B2 | 10/2004 | Xu |
| 6,815,704 | B1 | 11/2004 | Chen |
| 6,861,267 | B2 | 3/2005 | Xu et al. |
| 6,864,500 | B2 | 3/2005 | Gilton |
| 6,864,503 | B2 | 3/2005 | Lung |
| 6,867,638 | B2 | 3/2005 | Saiki et al. |
| 6,888,750 | B2 | 5/2005 | Walker et al. |
| 6,894,305 | B2 | 5/2005 | Yi et al. |
| 6,927,410 | B2 | 8/2005 | Chen |
| 6,933,516 | B2 | 8/2005 | Xu |
| 6,936,840 | B2 | 8/2005 | Sun et al. |
| 6,937,507 | B2 | 8/2005 | Chen |
| 6,992,932 | B2 | 1/2006 | Cohen |
| 2003/0203509 | A1 | 10/2003 | Rizzo et al. |
| 2004/0178404 | A1 * | 9/2004 | Ovshinsky ............... 257/4 |
| 2004/0195604 | A1 * | 10/2004 | Hwang et al. ............... 257/295 |
| 2004/0248339 | A1 | 12/2004 | Lung |
| 2005/0018526 | A1 * | 1/2005 | Lee ............... 365/232 |
| 2005/0215009 | A1 | 9/2005 | Cho |
| 2006/0237756 | A1 * | 10/2006 | Park et al. ............... 257/296 |
| 2007/0096248 | A1 * | 5/2007 | Philipp et al. ............... 257/528 |
| 2007/0108431 | A1 * | 5/2007 | Chen et al. ............... 257/4 |
| 2007/0246748 | A1 * | 10/2007 | Breitwisch et al. ............... 257/246 |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Adler, D. et al., "Threshold Switching in Chalcogenide-Glass Thin Films," J. Appl/ Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al. "An Edge Contact Type Cell fro Phase Change RAM Featuring Very Low Power Consumption," 2003 Symposium on VLSI Technology Digest of Technical Papers, pp. 175-176.

Haring Bolivar, P. et al., "Lateral Design for Phase Change Random Access Memory Cells with Low-Current Consumption," presented at $3^{rd}$ E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE $43^{rd}$ Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel µTrench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era—vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

\* cited by examiner

STRUCTURES AND METHODS OF A BISTABLE RESISTIVE RANDOM ACCESS MEMORY

BACKGROUND OF THE INVENTION

1. Field of the Invention

The present invention relates to high density memory devices based on phase change based memory materials, including chalcogenide based materials and other materials, and to methods in the manufacturing of such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from a crystalline state to an amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

A specific issue arising from conventional phase change memory and structures is the heat sink effect of conventional designs. Generally, the prior art teaches the use of metallic electrodes on both sides of the phase change memory element, with electrodes of approximately the same size as the phase change member. Such electrodes act as heat sinks, the high heat conductivity of the metal rapidly drawing heat away from the phase change material. Because the phase change occurs as a result of heating, the heat sink effect results in a requirement for higher current, in order to effect the desired phase change.

Moreover, problems have arisen in manufacturing such devices with very small dimensions, and with variations in process that meet tight specifications needed for large-scale memory devices. It is desirable therefore to provide a memory cell structure having small dimensions and low reset currents, as well as a structure that addresses the heat conductivity problem, and a method in the manufacturing of such structure that meets tight process variation specifications needed for large-scale memory devices. It is further desirable to provide a manufacturing process and a structure, which are compatible with manufacturing of peripheral circuits on the same integrated circuit.

SUMMARY OF THE INVENTION

The present invention describes structures and methods to form a bistable resistive random access memory for reducing the amount of heat dissipation from electrodes by confining a heating region in the memory cell device. The heating region is confined in a kernel comprising a programmable resistive memory material that is in contact with an upper programmable resistive memory member and a lower programmable resistive memory member. The lower programmable resistive member has sides that align with sides of a bottom electrode comprising a tungsten plug. The lower programmable resistive member and the bottom electrode function a first conductor so that the amount of heat dissipation from the first conductor is reduced. The programmable resistive memory material in the kernel is in contact with an upper programmable resistive memory material. The upper programmable resistive memory material and a top electrode function a second conductor so that the amount of heat dissipation from the second conductor is reduced.

In a first aspect of the invention, a memory device comprises a first electrode vertically separated from a second electrode comprising a plug, an upper programmable resistive memory member having a contact surface in electrical contact with the first electrode, a lower programmable resistive memory member having a contact surface in electrical contact with the second electrode, the lower programmable resistive member having sides that align with sides of the plug, and a kernel member comprising a programmable resistive memory material disposed within a spacer for confining the heating region of a phase change memory and disposed in between the upper and lower programmable resistive members, the kernel member in electric contact with the upper and lower programmable resistive members.

In a second aspect of the invention, a memory device comprises a first electrode vertically separated from a second electrode comprising a plug, an upper programmable resistive memory member having a contact surface in electrical contact with the first electrode, a lower programmable resistive memory member having a contact surface in electrical contact with the second electrode, the lower programmable resistive member having sides that align with sides of the plug, and a kernel member comprising a programmable resistive memory material disposed within a via for confining the heating region of a phase change memory and disposed in between the upper and lower programmable resistive members, the kernel member in electric contact with the upper and lower programmable resistive members.

A relatively small area of resistive memory material within a dielectric spacer or via that represents an active region is referred to as a heating region. The low heat dissipation from the surroundings of the heating region, which may include other resistive memory materials, a dielectric spacer and a dielectric layer reduces the amount of heat dissipation from a conductive material, such as a metal bit line or a tungsten plug, which in turn reduces the SET and RESET programming current. In addition, the heat dissipation from a top electrode (e.g., a metal bit line and an upper resistive memory material) and a bottom electrode (e.g., a tungsten plug and a lower resistive memory material) is also reduced. A programmable resistive memory material is disposed underneath the top electrode such that the programmable resistive memory material possesses a low thermal conductivity property for dissipating heat before reaching the top electrode. A programmable resistive memory material is filled in a top portion of a tungsten plug so that the resistive memory material dissipates heat before reaching the tungsten plug. Furthermore, the resistive memory material that is deposited into the top portion of the tungsten plug is self-aligned with the width of the tungsten plug.

A memory array is described comprising a plurality of such memory devices with access transistors, arranged in a high density array of rows and pins. The access transistors comprise source and drain regions in a semiconductor substrate, and a gate coupled to word lines along rows of memory cells. The memory cells are formed in a layer above the access transistors on the integrated circuit, with a contact extending from the drain of a corresponding access transistor to the bottom electrode on the respective memory devices. Bit lines are formed using a layer of metallization above the memory cells, with contacts extending from the top electrode on the respective memory devices to corresponding bit lines along pins of memory cells in the array. In an embodiment described, two rows of memory cells share source contacts, with a common source line coupled to the source contact and extending generally parallel to the word lines through the array.

Advantageously, the present invention reduces the amount of heat dissipation in which the upper and lower programmable resistive memory members assist in dissipating heat generated from a heating region of the kernel. The present invention also reduces the amount of programming current.

The structures and methods pertaining to the present invention are disclosed in the detailed description below. This summary does not purport to define the invention. The invention is defined by the claims. These and other embodiments, features, aspects, and advantages of the technology can be understood with regard to the following description, appended claims and accompanying drawings.

BRIEF DESCRIPTION OF THE DRAWINGS

The invention will be described with respect to specific embodiments thereof, and reference will be made to the drawings, in which.

DETAILED DESCRIPTION

Figure 1:
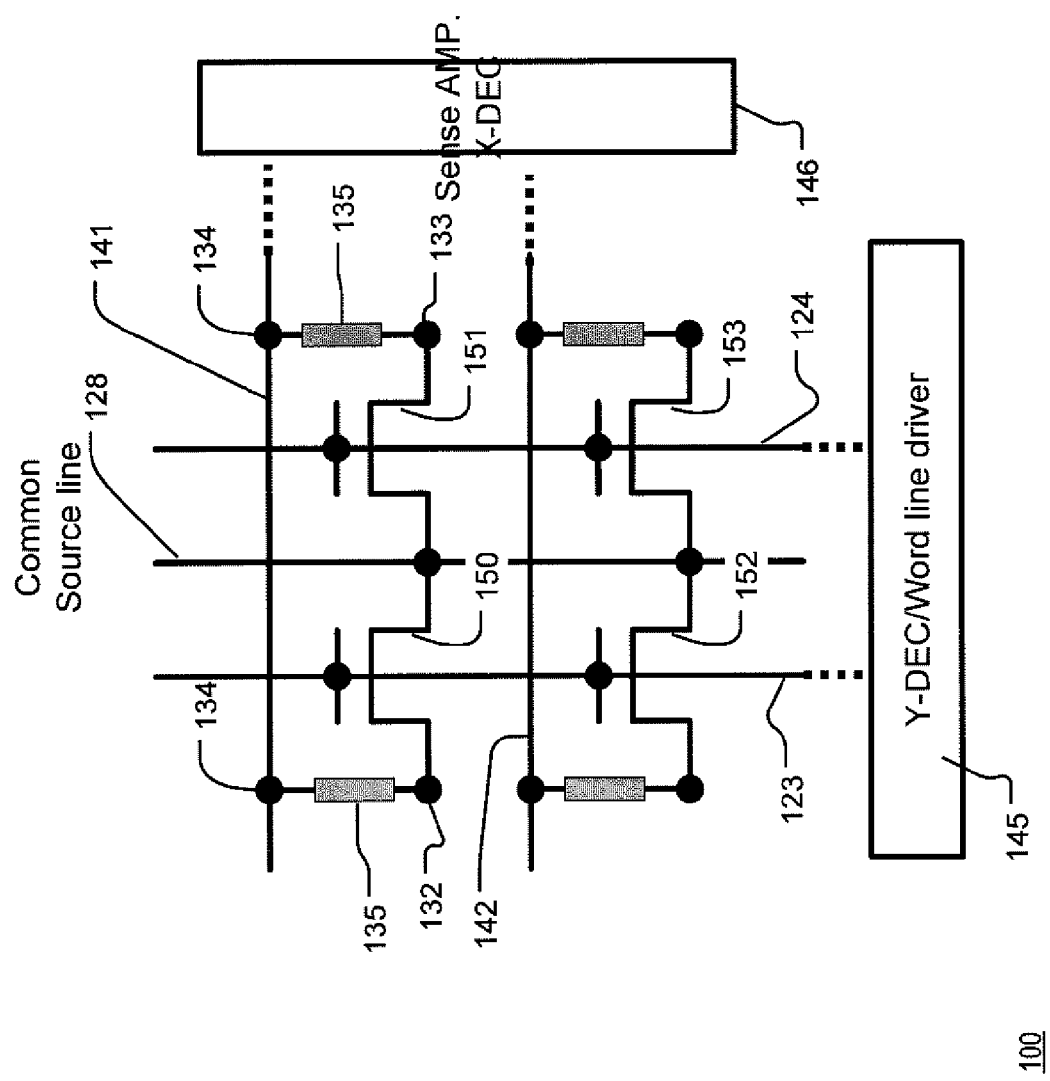
FIG. 1 illustrates a schematic diagram of a bistable resistive random access memory array in accordance with the present invention.

A description of structural embodiments and methods of the present invention is provided with reference to FIGS. 1-11. It is to be understood that there is no intention to limit the invention to the specifically disclosed embodiments but that the invention may be practiced using other features, elements, methods and embodiments. Like elements in various embodiments are commonly referred to with like reference numerals.

Referring now to FIG. 1, there is shown a schematic illustration of a memory array 100, which can be implemented as described herein. In the schematic illustration of FIG. 1, a common source line 128, a word line 123 and a word line 124 are arranged generally parallel in the Y-direction. Bit lines 141 and 142 are arranged generally parallel in the X-direction. Thus, a Y-decoder and a word line driver in a block 145 are coupled to the word lines 123, 124. An X-decoder and a set of sense amplifiers in block 146 are coupled to the bit lines 141 and 142. The common source line 128 is coupled to the source terminals of access transistors 150, 151, 152 and 153. The gate of access transistor 150 is coupled to the word line 123. The gate of access transistor 151 is coupled to the word line 124. The gate of access transistor 152 is coupled to the word line 123. The gate of access transistor 153 is coupled to the word line 124. The drain of access transistor 150 is coupled to the bottom electrode member 132 for side wall pin memory cell 135, which has top electrode member 134. The top electrode member 134 is coupled to the bit line 141. Likewise, the drain of access transistor 151 is coupled to the bottom electrode member 133 for side wall pin memory cell, which has top electrode member 137. The top electrode member is coupled to the bit line 141. Access transistors 152 and 153 are also coupled to corresponding side wall pin memory cells on bit line 142. It can be seen that the common source line 128 is shared by two rows of memory cells, where a row is arranged in the Y-direction in the illustrated schematic. In other embodiments, the access transistors can be replaced by diodes, or other structures for controlling current flow to selected devices in the array for reading and writing data.

Figure 2:
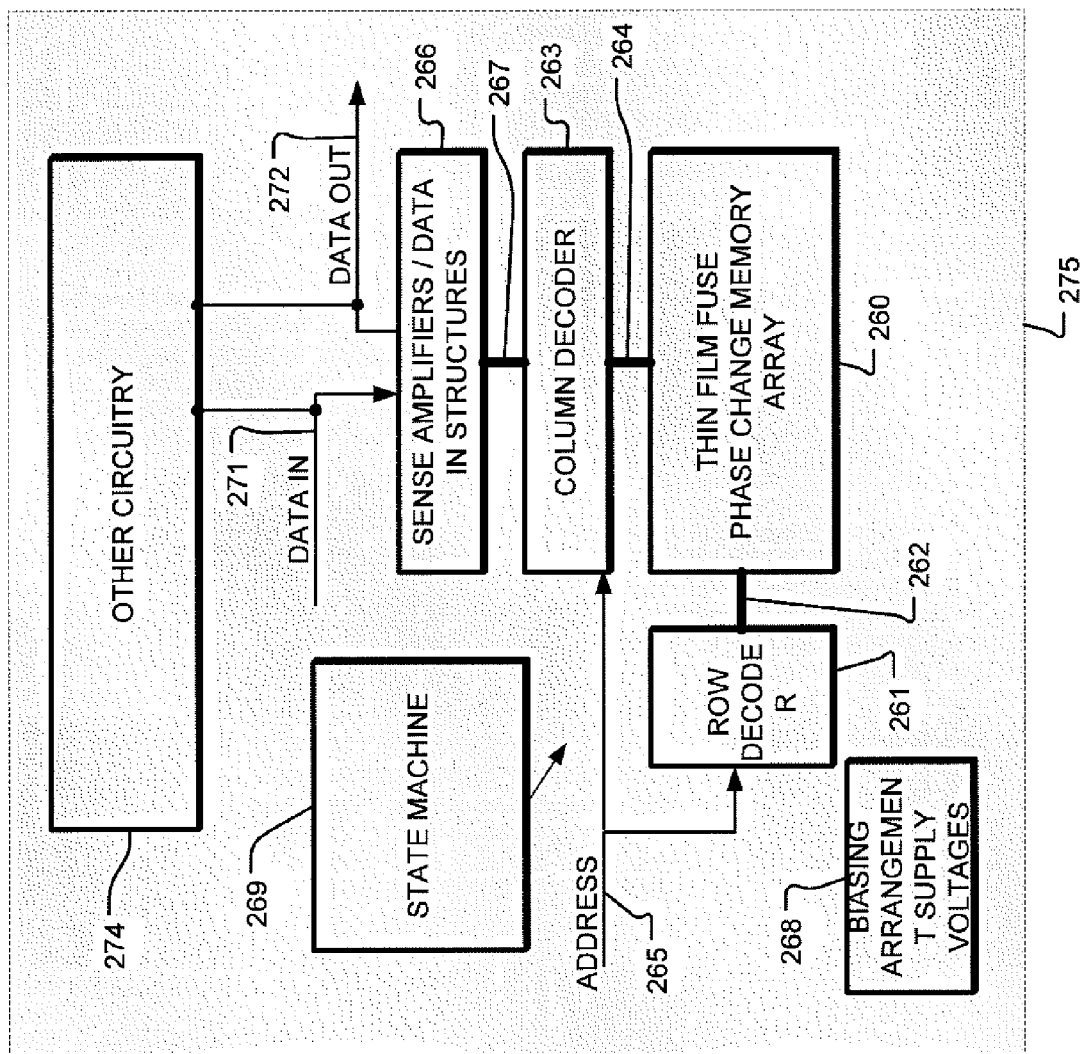
FIG. 2 illustrates a simplified block diagram of an integrated circuit according to an embodiment of the present invention.

As illustrated in FIG. 2, there is shown a simplified block diagram of an integrated circuit 275 according to an embodiment of the present invention. The integrated circuit 275 includes a memory array 260 implemented using side wall active pin bistable resistive random access memory cells, on a semiconductor substrate. A row decoder 261 is coupled to a plurality of word lines 262, and arranged along rows in the memory array 260. A pin decoder 263 is coupled to a plurality of bit lines 264 arranged along pins in the memory array 260 for reading and programming data from the side wall pin memory cells in the array 260. Addresses are supplied on a bus 265 to a pin decoder 263 and a row decoder 261. Sense amplifiers and data-in structures in a block 266 are coupled to the pin decoder 263 via a data bus 267. Data is supplied via the data-in line 271 from input/output ports on the integrated circuit 275 or from other data sources internal or external to the integrated circuit 275, to the data-in structures in the block 266. In the illustrated embodiment, other circuitry 274 is included on the integrated circuit, such as a general purpose processor or special purpose application circuitry, or a combination of modules providing system-on-a-chip functionality supported by the thin film fuse bistable resistive random access memory cell array. Data is supplied via the data-out line 272 from the sense amplifiers in block 266 to input/output ports on the integrated circuit 275, or to other data destinations internal or external to the integrated circuit 275.

A controller implemented in this example using bias arrangement state machine 269 controls the application of bias arrangement supply voltages 268, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 3:
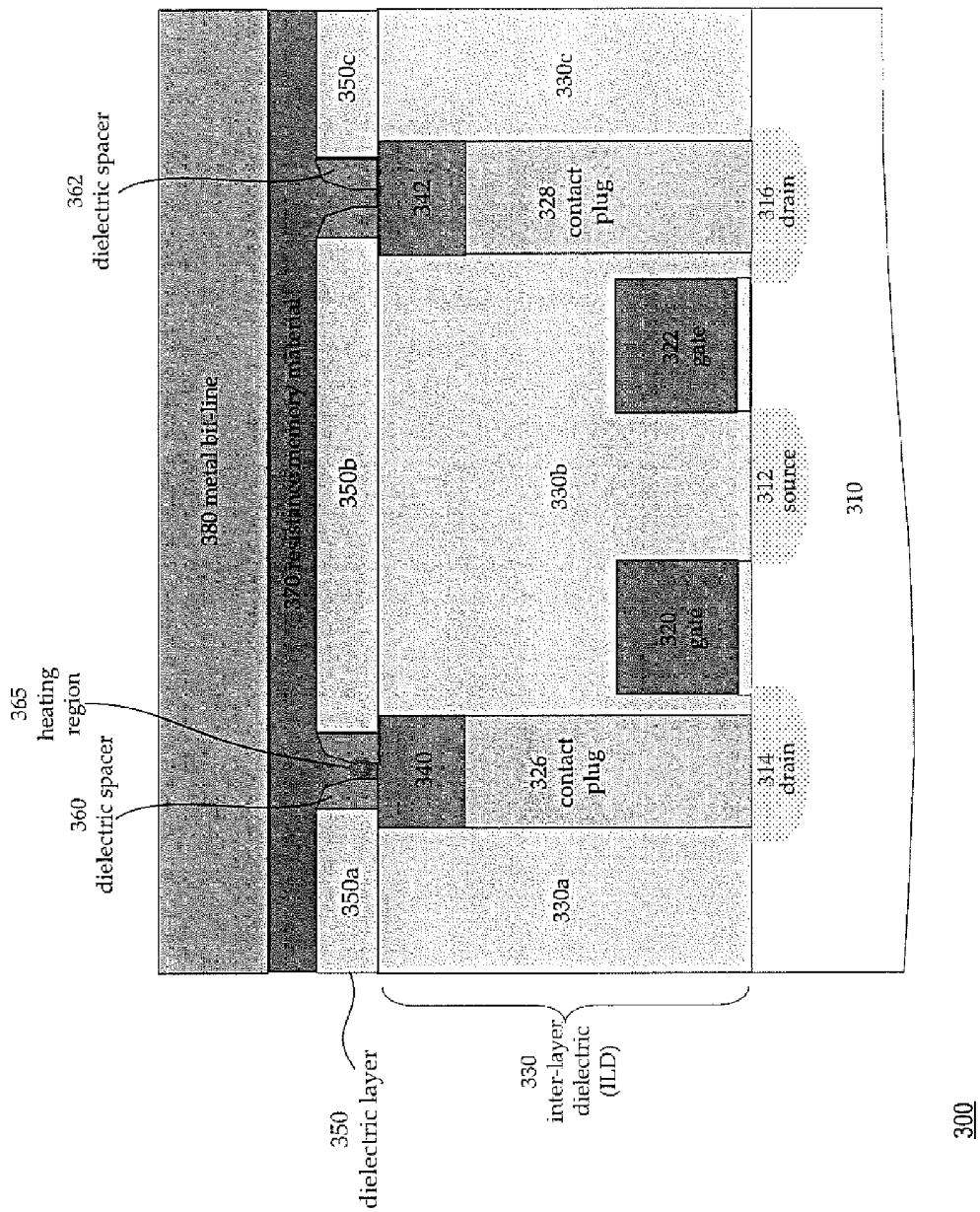
FIG. 3 illustrates a cross-sectional view of a process diagram of a bistable resistive random access memory with an I-shaped structure of programmable resistive memory materials in a first embodiment in accordance with the present invention.

As depicted in FIG. 3, there is shown a process diagram illustrating a cross-sectional view of a bistable resistive random access memory 300 with an I-shaped structure of programmable resistive memory materials according to a first embodiment of the present invention. The bistable resistive random access memory 300 is formed on a semiconductor substrate 310. Access transistors are formed by an n-type terminal 312 acting as a common source region and n-type terminals 314 and 316 acting as drain regions in the p-type substrate 310. Polysilicon word (gate) lines 320, 322 form the gates of the access transistors. An inter-layer dielectric 330 includes dielectric fills 330a, 330b and 330c where the dielectric fill 330b is formed over the polysilicon word lines 320, 322. The layer is patterned and conductive structures, including a common source line (not shown) and plug structures 326 and 328 are formed. The conductive material can be tungsten or other materials and combinations suitable for the plug and lines structures. The common source line contacts the source region and acts as a common source line along a row in the array. The plug structures 326, 328 contact the drain terminals 314 and 316, respectively. The plug structure 326 is etched in the top portion and filled with a programmable resistive memory material 340. The programmable resistive memory material 340 has sides that align with sides of the plug structure 326. The plug structure 328 is etched in the top portion and filled with a programmable resistive memory material 342. The programmable resistive memory material 342 has sides that align with sides of the plug structure 328.

A dielectric fill layer 350 overlies top surfaces of the dielectric fill 330a, the electrode member 340, the dielectric fill 330b, the electrode member 342 and the dielectric fill 330c. The dielectric fill layer 350 comprises silicon dioxide, a polyimide, silicon nitride or other dielectric fill materials. In some embodiments, the dielectric fill layer comprises a relatively good insulator for heat as well as for electricity, providing thermal and electrical isolation for the heating region 365 in the I-shaped structure. The dielectric fill layer 350 is etched and deposited with dielectric spacers 360, 362. The dielectric spacer 360 is located between a first dielectric fill segment 350a and a second dielectric fill segment 350b, while the dielectric spacer 362 is located between the second dielectric fill segment 350b and a third dielectric fill segment 350c. A programmable resistive memory material 370 is deposited into spacers 360, 362 and across the top surfaces of the first dielectric fill segment 350a, the second dielectric fill segment 350b, and the third dielectric fill segment 350c. The programmable resistive memory material 370 in the spacers 360, 362 is in contact with the programmable resistive memory material 340, 342. A metal bit line 380 overlies the programmable resistive memory material 370. The bistable resistive random access memory 300 has a heating region 365 that is located within the opening of the dielectric spacer 360. The I-shaped structure of the bistable resistive random access memory 300 refers to the composition of the programmable resistive memory material (upper programmable resistive memory member) 370, a heating region 365 comprising a programmable resistive memory material, and the programmable resistive memory material (lower programmable resistive memory member) 340.

Figure 4:
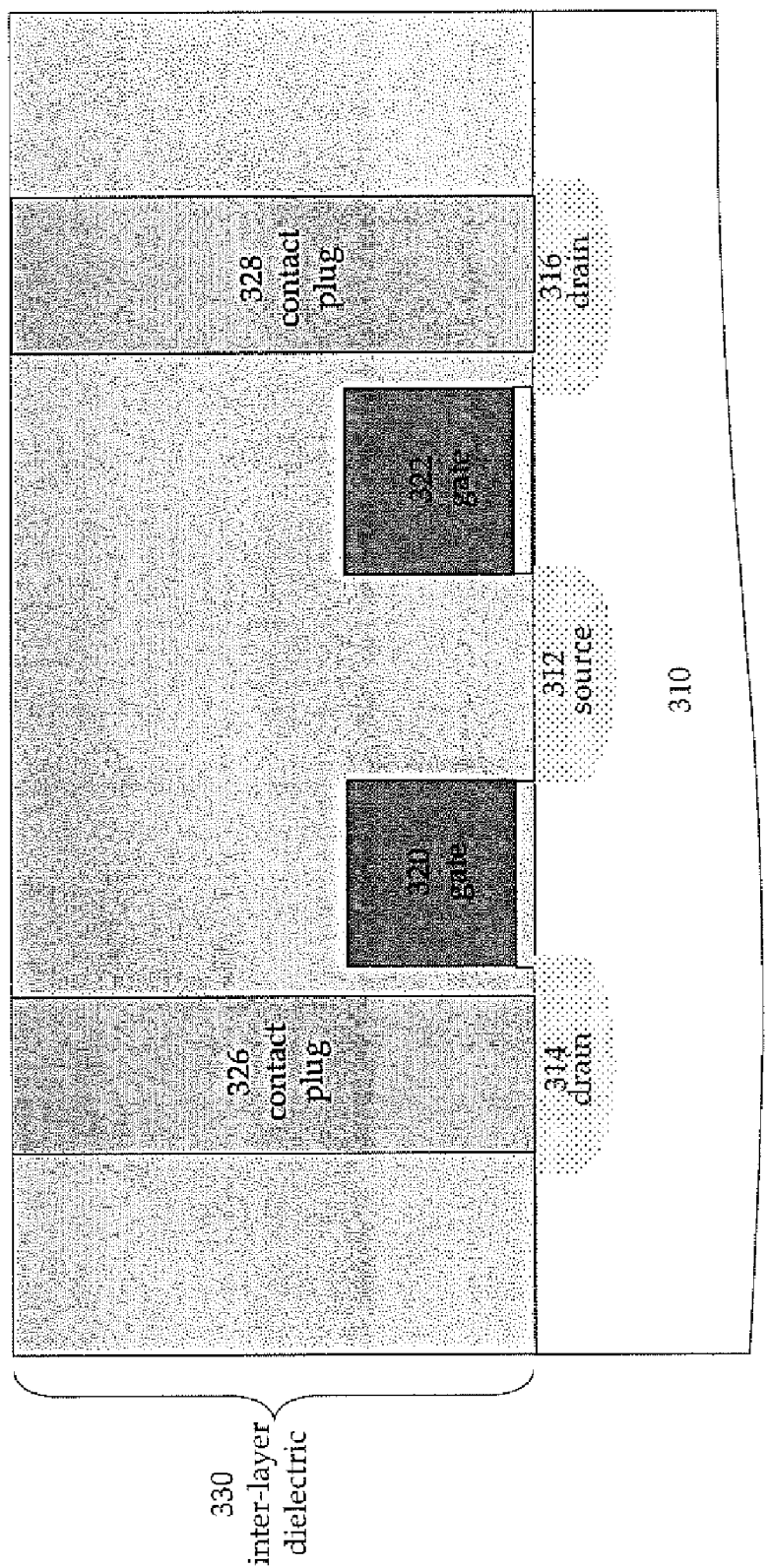
FIG. 4 illustrates a cross-sectional view of a process diagram showing a first step in the manufacturing of the bistable resistive random access memory with the formation of interlayer dielectric in accordance with the first embodiment of the present invention.
Figure 5:
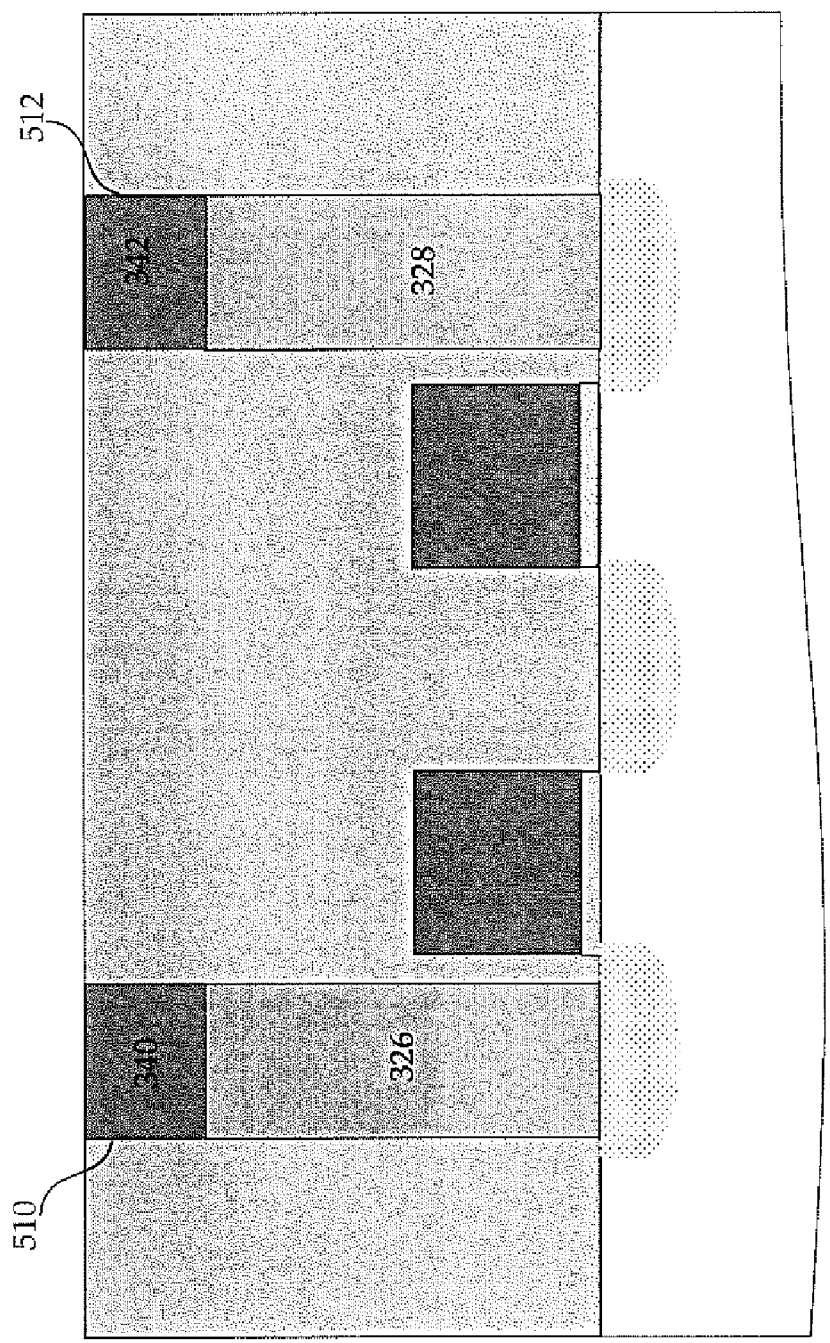
FIG. 5 illustrates a cross-sectional view of a process diagram showing a second step in the manufacturing of the bistable resistive random access memory by tungsten etching, forming a resistive memory material, and polishing in accordance with the first embodiment of the present invention.

A method in the manufacturing of the bistable resistive random access memory 300 is discussed with reference to FIG. 4-11. FIG. 4 is a cross-sectional view of a process diagram illustrating a first step in the manufacturing of the bistable resistive random access memory 300 with the formation of a simplified transistor structure 400 in accordance with the first embodiment. The transistor structure 400 comprises the n-type terminal 312 acting as a common source region and n-type terminals 314 and 316 acting as drain regions formed on the p-type substrate 310. Although the transistor structure 400 illustrated is a common source structure, the present invention can be implemented with other types of transistor designs. The polysilicon gate lines 320, 322 form the gates of the access transistors. The inter-layer dielectric 330 includes dielectric fills 330a, 330b and 330c where the dielectric fill 330b is formed over the polysilicon word lines 320, 322. Some suitable materials for implementing the inter-layer dielectric 330 include BPSG oxide and PETEOS oxide. The layer is patterned and conductive structures, including the plug structures 326 and 328, are formed. The conductive material can be implemented with tungsten or other materials and combinations that are suitable for the plug and lines structures. The plug structures 326, 328 contact the drain terminals 314 and 316, respectively In FIG. 5, there is shown a cross-sectional view of a process diagram 500 illustrating the first embodiment in a second step in the manufacturing of the bistable resistive random access memory 300 by tungsten etching, forming a resistive memory material and polishing. A top portion of the plug 326 is etched directly to remove tungsten to create a contact hole 510 from the plug 326 with an etched aspect ratio of approximately 1:1. Similarly, a top portion of the plug 328 is etched directly to remove tungsten to create a contact hole 512 from the plug 328 with an etched aspect ratio of approximately 1:1. Selectivities of the inter-layer dielectric layer 330 are sufficiently high to protect the interlayer dielectric layer 330 from etching damage. A suitable type of chemistry for tungsten etching is Sulfur Hexafluoride (SF6). The depth of tungsten etching is chosen relative to the size of a contact hole. In one embodiment, the tungsten etching depth of the plug 326 is about 200 nm for a 0.2 μm contact hole.

A programmable resistive memory material 340 is deposited into the contact hole 510 of the plug 326, and a programmable resistive memory material 342 is deposited into the contact hole 512 of the plug 328. Each of the top surface of the programmable resistive memory materials 340, 342 is polished to remove excess programmable resistive memory materials 340, 342 that may have spilled outside of the contact holes 510, 512. Embodiments of the process for polishing include a chemical mechanical polishing process, followed by brush clean and liquid and/or gas clean procedures, as known in the art.

Figure 6:
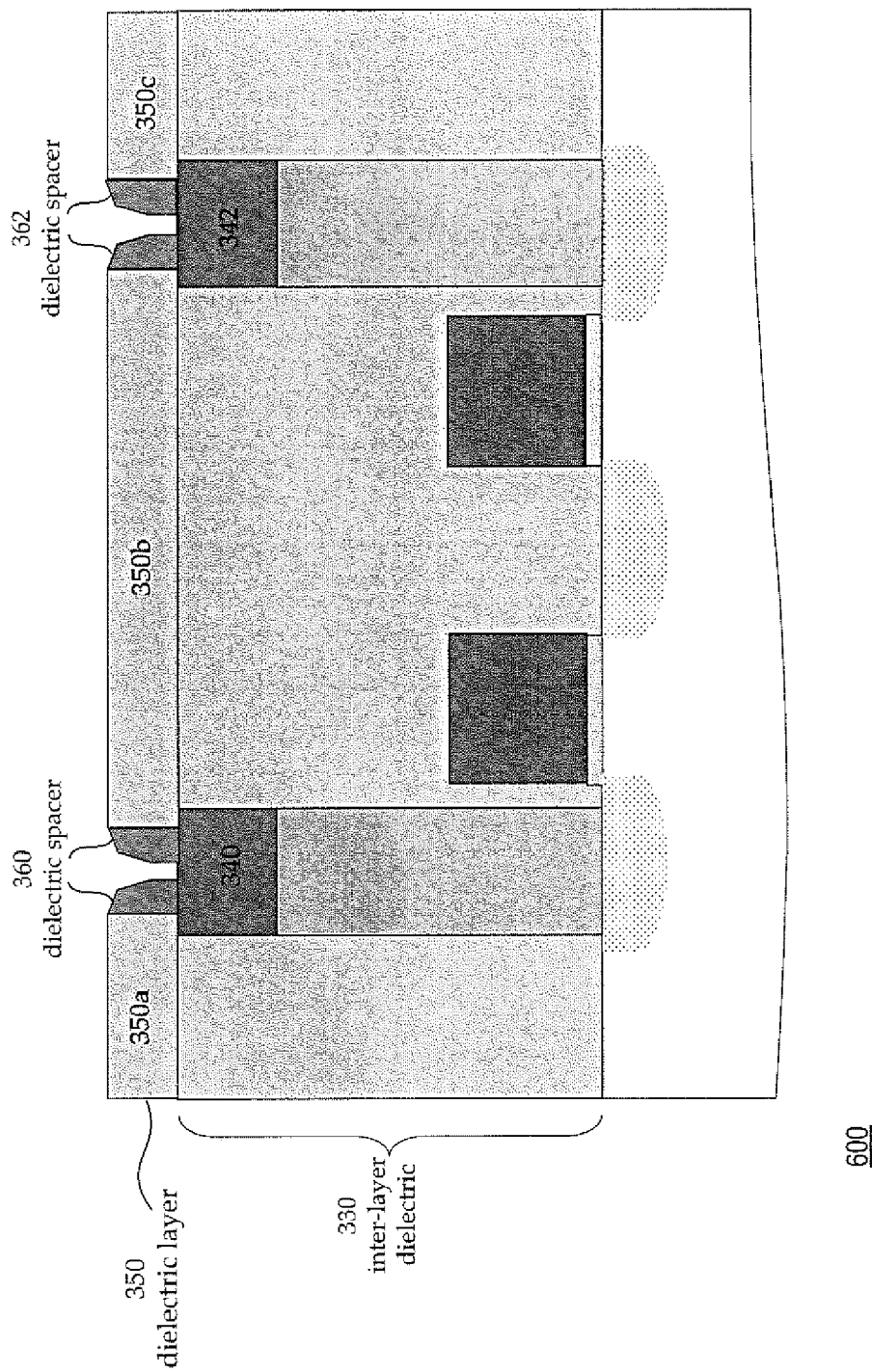
FIG. 6 illustrates a cross-sectional view of a process diagram showing a third step in the manufacturing of the bistable resistive random access memory by forming a dielectric layer deposition followed by dielectric spacer etching in accordance with the first embodiment of the present invention.

In FIG. 6, there is shown a cross-sectional view of a process diagram 600 illustrating a third step in the manufacturing of the bistable resistive random access memory by forming a dielectric layer 350 followed by dielectric spacer etching. The dielectric layer 350 is deposited over the top surfaces of the inter-layer dielectric 330 and the 340, 342 programmable resistive memory materials. One property that the dielectric layer 350 possesses is low thermal conductivity. The etching of dielectric layer holes extends to a contact hole, which has a critical dimension that is the same or smaller than the contact hole. Dielectric spacers 360, 362 also possess the characteristic of low thermal conductivity. A conformal dielectric deposition by chemical vapor deposition process is used to manufacture the dielectric spacers 360, 362 with a thickness ($t_2$) that is less than half the dimension of a contact hole. The dielectric spacers 360, 362 are anisotropically etched using a dry etch with F-based chemistries. The etching of the dielectric spacers 360, 362 stops at the depth which it reaches a top surface of programmable resistive memory materials 340, 342.

The dielectric fill layer 350 may include silicon oxide, silicon oxynitride, silicon nitride, $Al_2O_3$, other low K (low permittivity) dielectrics, or an ONO or SONO multi-layer structure. The term "low K" means low permittivity. Alternatively, the fill may comprise an electrical insulator including one or more elements selected from the group consisting of Si, Ti, Al, Ta, N, O, and C. In devices in which the dielectric layer 340 comprises silicon dioxide, the fill has a thermal conductivity less than that of silicon dioxide which is about 0.014 J/cm*deg K*sec. Representative thermally insulating materials include materials that are a combination of the elements silicon Si, carbon C, oxygen O, fluorine F, and hydrogen H. Examples of thermally insulating materials which are candidates for use for the thermally insulating fill layer include $SiO_2$, SiCOH, polyimide, polyamide, and fluorocarbon polymers. Other examples of materials which are candidates for use for the thermally insulating fill layer include fluorinated $SiO_2$, silsesquioxane, polyarylene ethers, parylene, fluoro-polymers, fluorinated amorphous carbon, diamond like carbon, porous silica, mesoporous silica, porous silsesquioxane, porous polyimide, and porous polyarylene ethers. A single layer or combination of layers within the pipe can provide thermal and electrical insulation.

Figure 7:
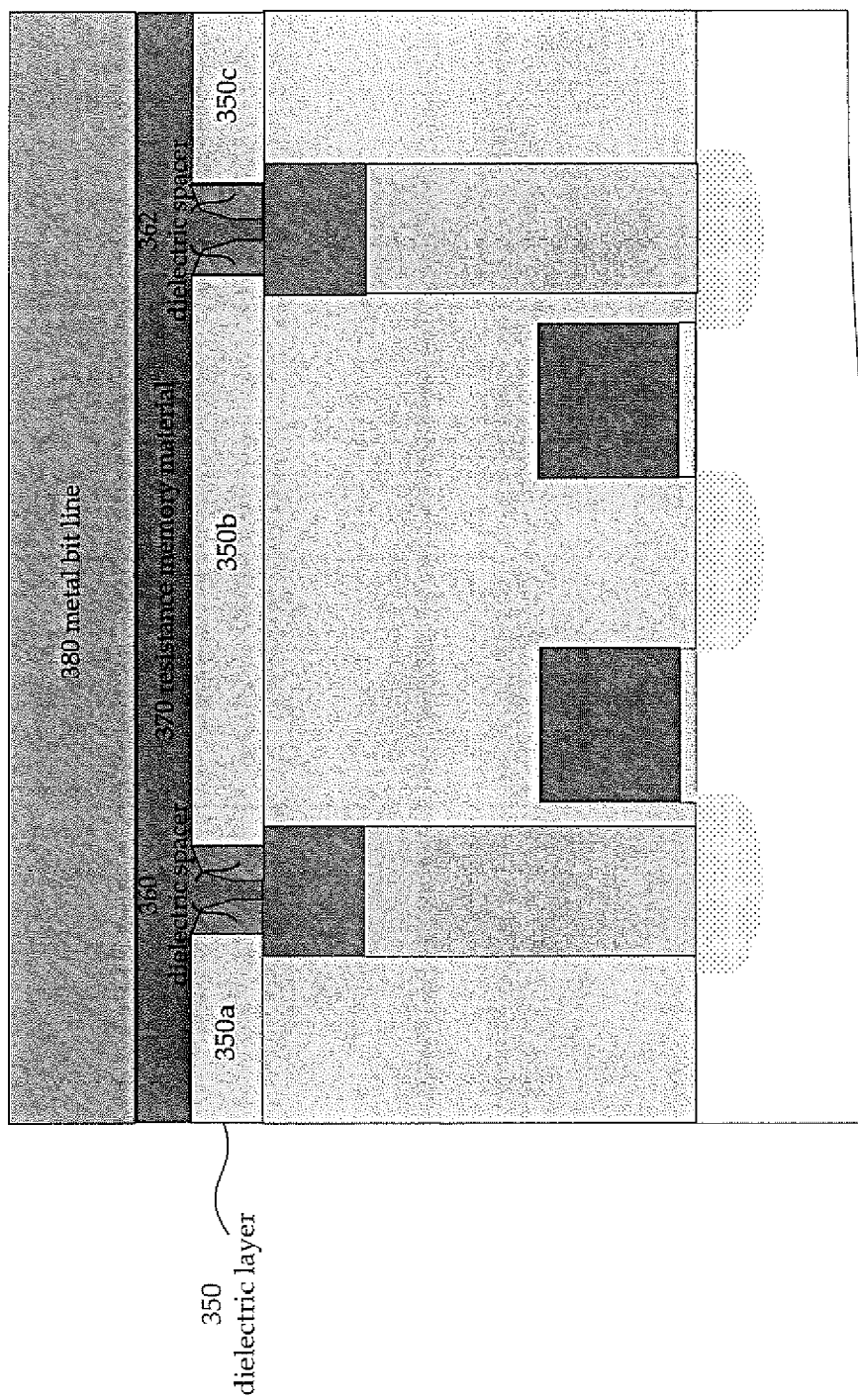
FIG. 7 illustrates a cross-sectional view of a process diagram showing a fourth step in the manufacturing of the bistable resistive random access memory with the deposition of a second resistive memory material and metal, followed by the patterning of a bit line in accordance with the first embodiment of the present invention.

FIG. 7 is a cross-sectional view of a process diagram 700 illustrating a fourth step in the manufacturing of the bistable resistive random access memory with the deposition of the second resistive memory material 370 and the metal bit line 380, followed by the patterning of a bit line. The second resistive memory material 370 is deposited into the dielectric spacers and overlies the first dielectric fill segment 350a, the second dielectric fill segment 350b, and the third dielectric fill segment 350c. The metal bit line 380 overlies the programmable resistive memory material 370. The metal bit line 380 can be implemented with a conductive material including TiN, TaN, TiN/AlCu, TaN/Cu and other types of similar conductive materials. Subsequently, the patterning of a bit line is carried out that is perpendicular to the direction of a gate, a source and a drain. The bit line etching forms a line with a film stack of the upper resistive memory material 370 and the metal bit line 380. The metal bit line 380 and the upper resistive memory material 370 are referred to as a top electrode. Alternatively, the metal bit line 380 is referred to as a top electrode that is disposed above the upper programmable resistive memory material 370 where the upper programmable resistive memory material 370 reduces the amount of heat dissipation to the metal bit line 380. One feature of the present invention is that the top electrode (i.e., the metal bit line 380) is not patterned to define a particular memory cell. In a patterned top electrode, the metal bit line is etched on both sides of an individual memory cell to create a pillar structure. In the present invention, the metal bit line 380 extends across an entire bit line, e.g. a plurality of memory cells, so that the metal bit line 380 serves as a top electrode that is common to multiple memory cells.

Figure 8:
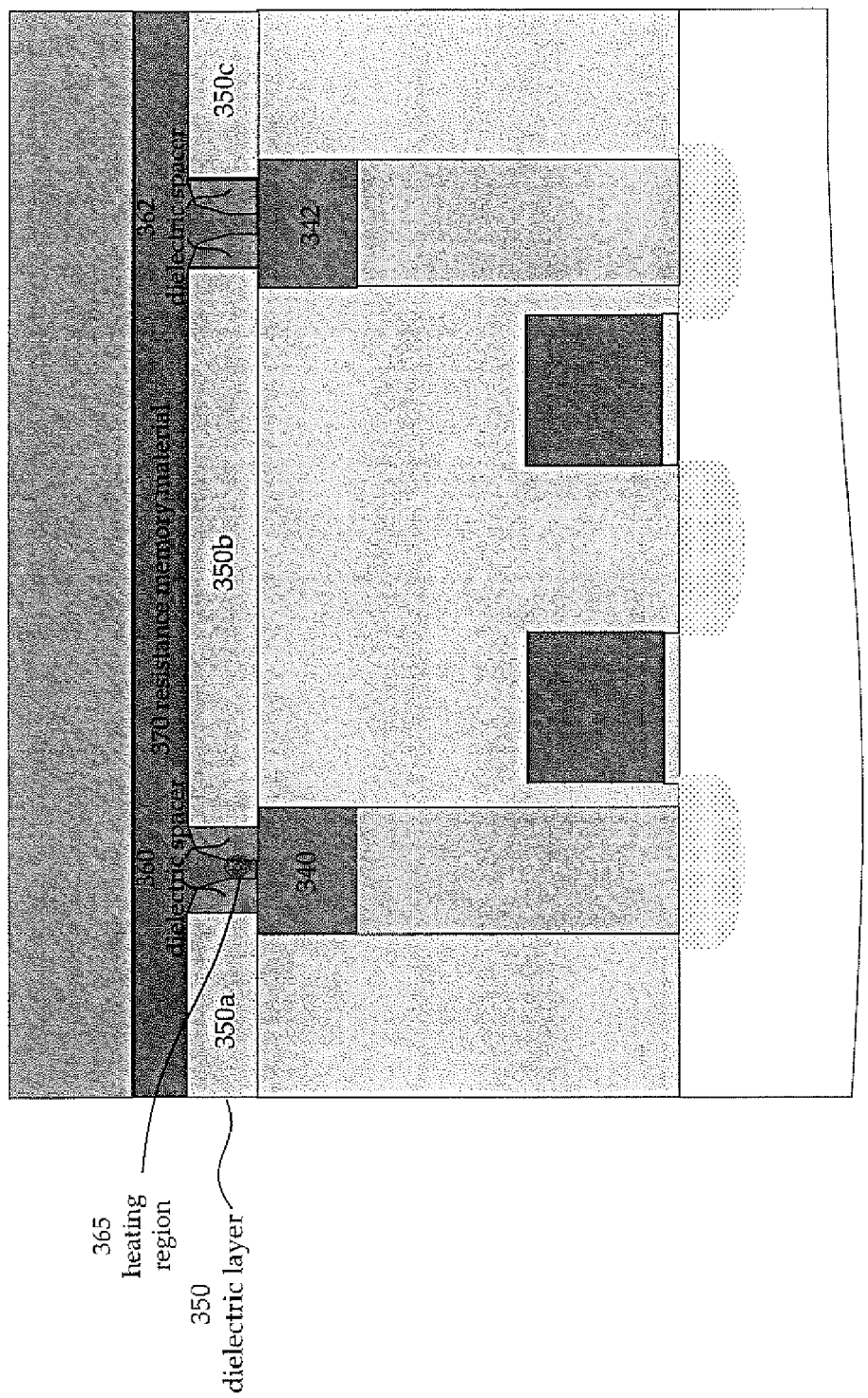
FIG. 8 illustrates a cross-sectional view of a process diagram showing a heating region in the bistable resistive memory in accordance with the first embodiment of the present invention.

FIG. 8 is a process diagram illustrating a heating region in the resistive memory material 800. The dielectric spacer 360 defines a relatively small contact hole in which a lesser amount of resistive memory material is deposited, comparing to the resistive memory material 340 deposited below into the top portion of the contact plug 326 and the resistive memory material 370 deposited above. The term "heating region" 365 refers to a small area within the dielectric spacer 360 that comprises programmable resistive memory material that is capable of making a phase change. The current density at the heating region 365 is at the highest during SET and RESET programming. The resistive memory materials 370, 340, 342, the dielectric spacers 360, 362, and the dielectric layer 350 possess low thermal properties. In one embodiment, the resistive memory materials 370, 340, 342 have thermal properties that are lower than the dielectric spacers 360, 362. The dielectric spacers 360, 362 have thermal properties that are lower than the dielectric layer 350. In another embodiment, the dielectric spacers 360, 362 have the same thermal properties as the dielectric layer 350. The heat generated from the heating region 365 does not dissipate well because the heating region 365, which has resistive memory material, is surrounded by resistive memory materials, the dielectric spacers 360, and the dielectric layer 350. As a result, the amount of heat dissipation from the heating region 365 is reduced significantly. Furthermore, the small area of the resistive memory material in the heating region 365, as well as the low heat dissipation from the resistive memory material 370, the dielectric layer 360, and the metal bit line 380, contribute to reducing the SET and RESET programming current.

The resistive memory material 370 can be selected from a wide variety of materials, including but not limited to, a chalcogenide material, a colossal magnetoresistive (CMR) material, a 2-element compound and a polymer material. The resistive memory materials 340, 342 are associated with a bottom electrode, i.e. the contact plugs 326, 328. The resistive memory material 340 and the contact plug 326 function as a bottom electrode. The resistive memory material 370 is associated with a top electrode, i.e. the metal bit line 380. The resistive memory material 370 and the metal bit line 380 function as a top electrode. Various types or combinations of resistive memory materials can be utilized without departing from the spirit of the present invention. In one embodiment, the resistive memory materials 340, 342 are the same as the resistive memory material 370. In another embodiment, the resistive memory material 370 is selected from a chalcogenide material, while the resistive memory materials 340, 342 are selected from either a colossal magnetoresistive material, a two-element compound or a polymer material.

Embodiments of the memory cell include phase change based memory materials, including chalcogenide based materials and other materials, for the bridge. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IV of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include Ge2Sb2Te5, GeSb2Te4 and GeSb4Te7. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_x Sb_y Te_z$ with x:y:z=2:2:5. Other compositions of $Ge_x Sb_y Te_z$ include x:0~5; y:0~5; z:0~10.

Other programmable resistive memory materials may be used in other embodiments of the invention, including N2 doped GST, $Ge_x Sb_y$, or other material that uses different crystal phase changes to determine resistive; $Pr_x Ca_y MnO_3$, PrSrMnO, ZrOx, or other material that uses an electrical pulse to change the resistive state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, $C_{60}$-TCNQ, TCNQ doped with other metal, or any other polymer material that has bistable or multi-stable resistive state controlled by an electrical pulse; a colossal magnetoresistive (CMR) material such as PrxCayMnO3 with x:y=0.5:0.5, or other composition with x:0~1; y:0~1, or another CMR material that includes Mn oxide; and a 2-element compound such as $Ni_x O_y$ where x:y=0.5:0.5, or other composition with x:0~1; y:0~1.

Figure 9:
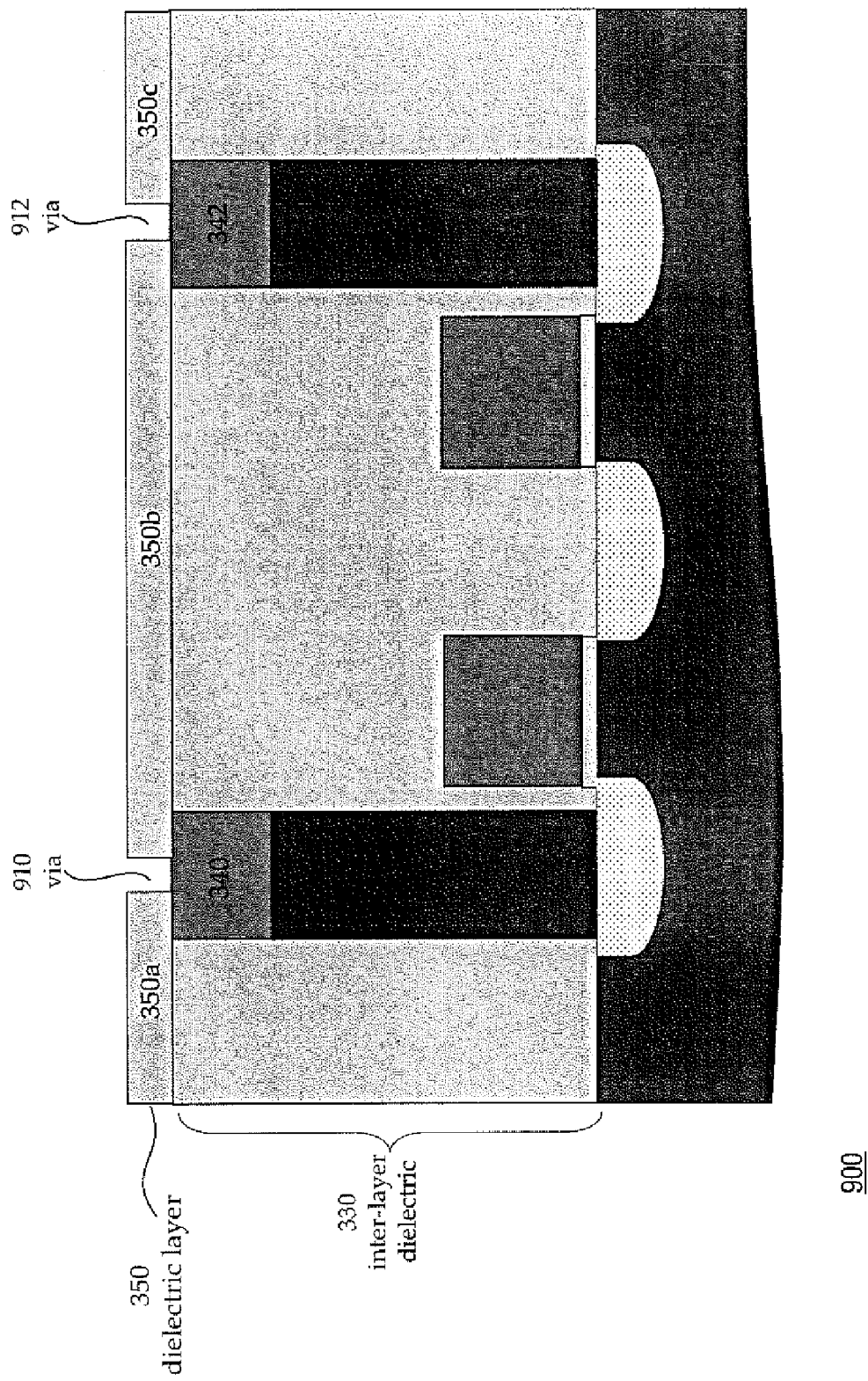
FIG. 9 illustrates a cross-sectional view of a process diagram in the manufacturing of the bistable resistive memory with the formation of a via in accordance with a second embodiment of the present invention.

FIG. 9 is a cross-sectional view of a process diagram 900 illustrating a second embodiment of the bistable resistive memory with the formation of a via. The dielectric layer 350 is deposited over the top surfaces of the inter-layer dielectric 330 and the programmable resistive memory materials 340, 342. In one embodiment, the dielectric layer 350 comprises silicon dioxide that is deposited using a chemical vapor deposition process. One property that the dielectric layer 350 possesses is the characteristic of low thermal conductivity. The etching of dielectric layer holes extends to a contact hole, which has a critical dimension that is the same or smaller than the contact hole. A relatively small via 910 has a critical dimension that is significantly less than the contact plug 326. The via 910 is patterned to land on the resistive memory material 340 in the contact plug 326. In one embodiment, the via 910 has a critical dimension ranging from about 10 nm to about 100 nm. The aspect ration of the via ranges from about 1 to about 2.

Figure 10:
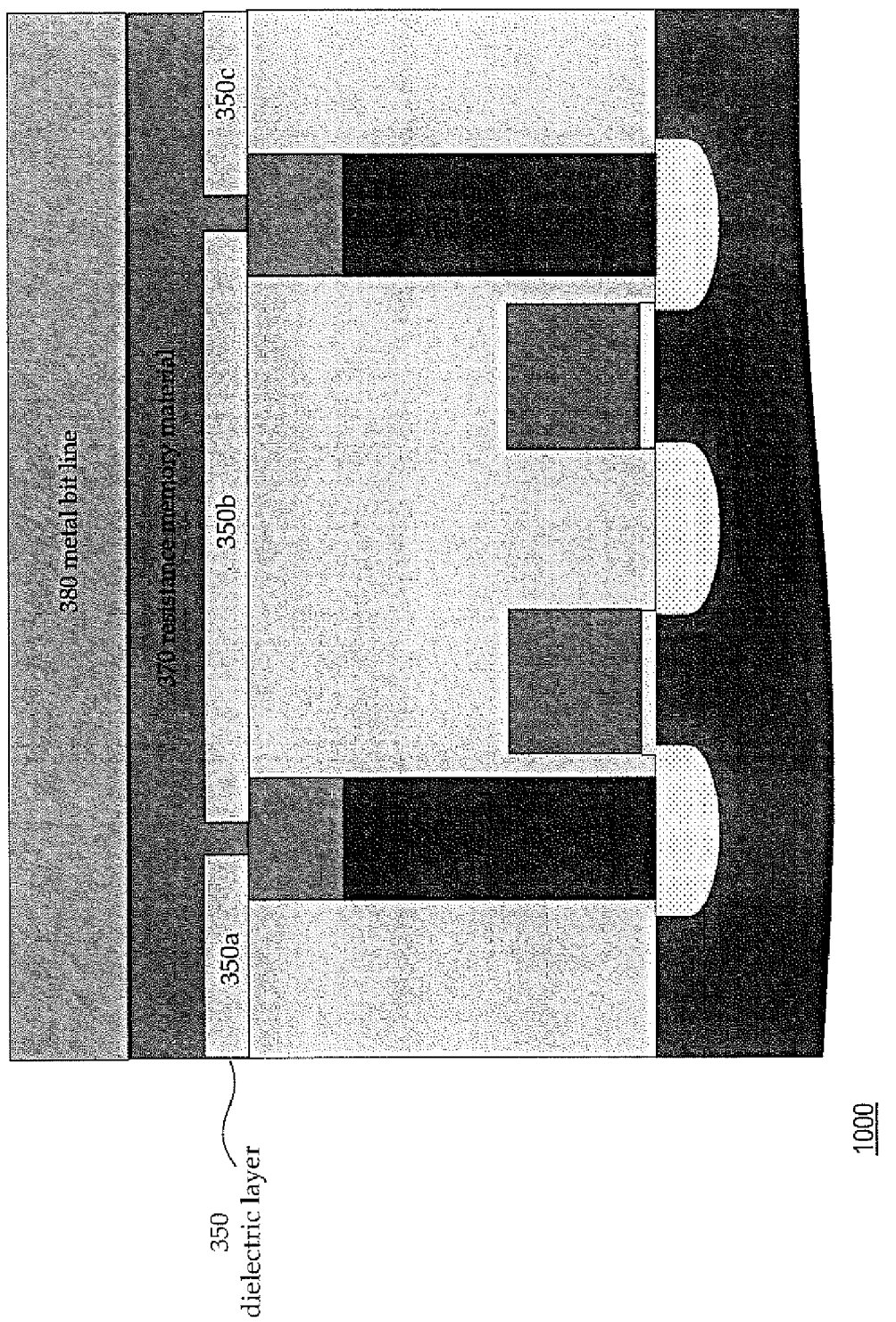
FIG. 10 illustrates a cross-sectional view of a process diagram showing a next step in the manufacturing of the bistable resistive memory with resistive memory material and metal depositions, and patterning of a bit line in accordance with a second embodiment of the present invention.

FIG. 10 illustrates a cross-sectional view of a process diagram 1000 in the manufacturing of the bistable resistive memory in a next step of the second embodiment with resistive memory material and metal depositions, and patterning of a bit line. The second resistive memory material 370 is deposited into the vias 910, 912 and overlies the first dielectric fill segment 350a, the second dielectric fill segment 350b, and the third dielectric fill segment 350c. The metal bit line 380 overlies the programmable resistive memory material 370. The metal bit line 380 can be implemented with a conductive material including TiN, TaN, TiN/AlCu, TaN/Cu and other types of similar conductive materials. Subsequently, the patterning of a bit line is carried out that is perpendicular to the direction of a gate, a source and a drain. The bit line etching forms a line with a film stack of the second resistive memory material 370 and the metal bit line 380.

Figure 11:
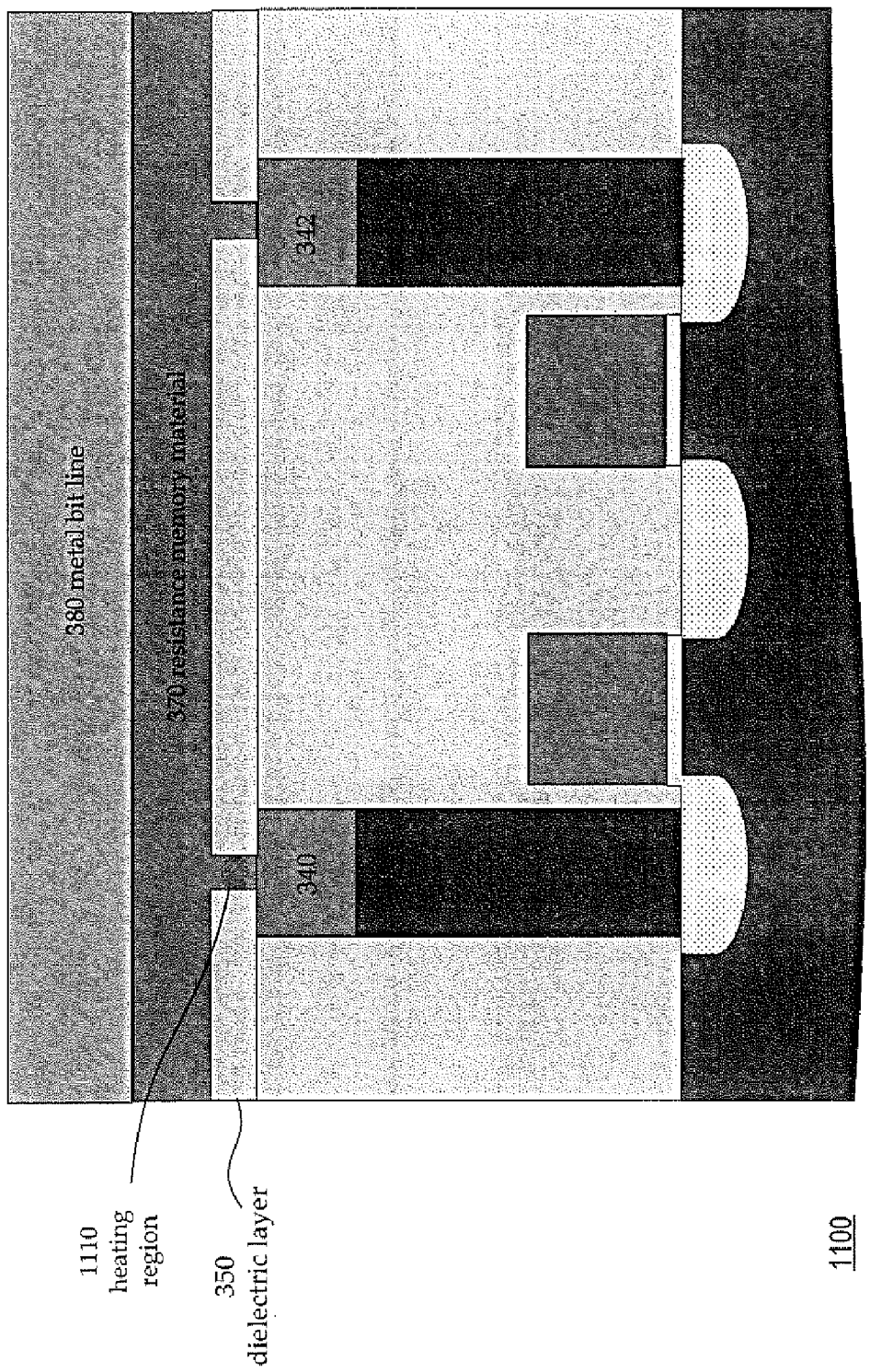
FIG. 11 illustrates a cross-sectional view of a process diagram showing a next step in the manufacturing of the bistable resistive memory with the formation of a via in accordance with a second embodiment of the present invention.

FIG. 11 illustrates a cross-sectional view of a process diagram in the manufacturing of the bistable resistive memory 1110 in a heating region in the resistive memory material of the second embodiment by forming a via. Each via 910 or 912 defines a relatively small contact hole in which a lesser amount of resistive memory material is deposited, compared to the resistive memory material 340 deposited below into the top portion of the contact plug 326, and the resistive memory material 370 deposited above. A heating region 1110 occurs in a small area within the via 910 that holds the resistive memory material. The current density at the heating region 1110 is at the highest during SET and RESET programming. The resistive memory materials 370, 340, 342 and the dielectric layer 350 possess low thermal properties. In one embodiment, the resistive memory materials 370, 340, 342 have thermal properties that are lower than the dielectric layer 350. The heat generated from the heating region 365 does not dissipate well because the heating region 365, which has resistive memory material, is surrounded by resistive memory materials and the dielectric layer 350. As a result, the amount of heat dissipation from the heating region 1110 is reduced significantly. Furthermore, due to the small area of the resistive memory material in the heating region 1110, as well as the low heat dissipation from the resistive memory material 370, the dielectric layer 360, and the metal bit line 380, the SET and RESET programming current is also reduced.

For additional information on the manufacturing, component materials, use and operation of phase change random access memory devices, see U.S. patent application Ser. No. 11/155,067 entitled "Thin Film Fuse Phase Change RAM and Manufacturing Method", filed on 17 Jun. 2005, owned by the assignee of this application and incorporated by reference as if fully set forth herein.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

We claim:

1. A memory device comprising:
a top electrode structure vertically separated from a bottom electrode, the bottom electrode comprising a plug;
an upper programmable resistive memory member having a contact surface in contact with the top electrode structure and having a bottom surface area;
a lower programmable resistive memory member having a contact surface in contact with the bottom electrode and having a top surface area;
a lower dielectric fill layer surrounding the bottom electrode and the lower programmable resistive memory member, the lower dielectric fill layer having a top surface;
an upper dielectric fill layer having a via extending therethrough over the lower programmable resistive memory member, the via having a bottom surface area smaller than the top surface area of the lower programmable resistive memory member, the upper dielectric fill layer having a bottom surface;
a first interface between the top surface area of the lower programmable resistive area and the bottom surface area of the upper programmable resistive memory member;
a second interface between the top surface of the lower dielectric fill layer and the bottom surface of the upper dielectric fill layer, wherein the first interface and the second interface are coplanar;
a dielectric sidewall spacer within the via and on the lower programmable resistive memory member, the dielectric sidewall spacer having an inner surface defining an opening within the via; and
a kernel member comprising a programmable resistive memory material within the opening of the dielectric sidewall spacer and extending from the upper to the lower programmable resistive memory member, the kernel member having a width less than that of the upper and lower programmable resistive memory members,
wherein the upper programmable resistive memory member, the lower programmable resistive memory member, and the kernel member, each have a lower thermal conductivity than the dielectric sidewall spacer.

2. The memory device of claim 1, wherein the top electrode structure is a portion of a bit line common to a plurality of memory cells.

3. The memory device of claim 1, wherein the upper programmable resistive member and the top electrode structure function as a first conductor.

4. The memory device of claim 1, wherein the bit line comprises a conductive material including TiN, TaN, TiN/AlCu or TaN/Cu.

5. The memory device of claim 1, wherein the lower programmable resistive member and the plug function as a second conductor.

6. The memory device of claim 1, wherein the plug comprises a tungsten plug.

7. The memory device of claim 1, wherein the plug comprises a poly plug.

8. The memory device of claim 1, wherein the upper programmable resistive memory member, the lower programmable resistive memory member, the kernel member, and the dielectric sidewall spacer each comprise material having a lower thermal conductivity than material of the top and bottom electrodes.

9. The device of claim 1, wherein the upper and lower programmable resistive memory members comprises the same type of programmable resistive material.

10. The memory device of claim 9, wherein the upper and lower programmable resistive memory members comprise GeSbTe.

11. The memory device of claim 9, wherein the upper and lower programmable resistive memory members comprise a combination of two or more materials from the group of Ge, Sb, Te, Se, In, Ti, Ga, Bi, Sn, Cu, Pd, Pb, Ag, S, or Au.

12. The memory device of claim 9, wherein the upper and lower programmable resistive memory members comprise a colossal magnetoresistance material.

13. The memory device of claim 9, wherein the upper and lower programmable resistive memory members comprise a 2-element compound.

14. The memory device of claim 1, wherein the upper and lower programmable resistive memory members comprise a polymer material.

15. The memory device of claim 1, wherein the upper programmable resistive memory member comprises a first type of programmable resistive memory material, and wherein the lower programmable resistive memory member is comprised of a second type of programmable resistive memory material.

16. The memory device of claim 15, wherein the upper programmable resistive memory member comprises the first type of material selected from a GeSbTe, a colossal magnetoresistance material, a 2-element compound or a polymer material, and the lower programmable resistive memory member is comprised of the second type of material selected from a GeSbTe, a colossal magnetoresistance material, a 2-element compound or a polymer material.

17. The memory device of claim 1, wherein the kernel member comprises a programmable resistive memory material that has at least two solid phases which are reversibly inducible by a current.

18. The memory device of claim 1, wherein the programmable resistive memory material comprises at least two solid phases including a generally amorphous phase and a generally crystalline phase.

19. The memory device of claim 1, wherein the dielectric sidewall spacer, the top electrode structure and the bottom electrode structure have respective thicknesses which are less than a minimum lithographic feature size of a lithographic process used to form the device.

20. The memory device of claim 1, wherein the dielectric sidewall spacer has a thickness of 10 to 20 nm.

21. The memory device of claim 1, wherein the kernel member has a thickness of about 80 nm or less.

22. The memory device of claim 1, further comprising a second via within an inter-layer dielectric, wherein the plug and the lower programmable resistive memory member are within the second via, the lower programmable resistive memory member extending to a top surface of the inter-layer dielectric.

23. The memory device of claim 1, wherein the upper programmable resistive memory member and the lower programmable resistive memory member have different materials.

24. The memory device of claim 1, wherein the dielectric fill layer has a lower thermal conductivity than silicon dioxide.

* * * * *